United States Patent
Randolph et al.

(10) Patent No.: US 6,168,637 B1
(45) Date of Patent: *Jan. 2, 2001

(54) USE OF A LARGE ANGLE IMPLANT AND CURRENT STRUCTURE FOR ELIMINATING A CRITICAL MASK IN FLASH MEMORY PROCESSING

(75) Inventors: Mark Randolph, San Jose; Timothy J. Thurgate, Sunnyvale; Scott D. Luning, San Francisco, all of CA (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/991,322

(22) Filed: Dec. 16, 1997

(51) Int. Cl.$^7$ ................................. H01L 21/8247
(52) U.S. Cl. .................. 29/25.01; 438/302; 438/257
(58) Field of Search .......................... 438/257–267, 438/302; 29/25.01

(56) References Cited

U.S. PATENT DOCUMENTS

| 5,366,915 | * | 11/1994 | Kodama . |
| 5,674,764 | * | 10/1997 | Liu et al. . |
| 5,770,502 | * | 6/1998 | Lee ........................................ 438/264 |
| 5,891,774 | * | 4/1999 | Ueda et al. ........................... 438/264 |
| 5,920,776 | * | 7/1999 | Fratin et al. ......................... 438/257 |
| 6,008,094 | * | 12/1999 | Krivokapic et al. ................. 438/286 |

* cited by examiner

Primary Examiner—Richard Booth
(74) Attorney, Agent, or Firm—Sawyer Law Group LLP

(57) ABSTRACT

A method and system for providing a flash memory cell on a semiconductor is disclosed. In one aspect, the method and system include providing a plurality of gate stacks and providing a drain implant at an angle. The plurality of gate stacks define a plurality of drain areas and a plurality of source areas. The angle is measured from a direction perpendicular to the surface of the semiconductor. The angle allows the plurality of gate stacks to block the drain implant from reaching the plurality of source areas. In another aspect, the method and system include providing a plurality of gate stacks and providing a source implant at an angle. The plurality of gate stacks define a plurality of drain areas and a plurality of source areas. The angle is measured from a direction perpendicular to the surface of the semiconductor. The angle allows the plurality of gate stacks to block the source implant from reaching the plurality of drain areas.

8 Claims, 2 Drawing Sheets

USE OF A LARGE ANGLE IMPLANT AND CURRENT STRUCTURE FOR ELIMINATING A CRITICAL MASK IN FLASH MEMORY PROCESSING

FIELD OF THE INVENTION

The present invention relates to flash memory and more particularly to a method and system for decoupling source and drain implants without requiring an additional mask.

BACKGROUND OF THE INVENTION

Conventional flash memory cells include a stacked gate, a source, and a drain. Typically, the stacked gate includes a floating gate and a control gate. In addition, the source and drain are typically not identical. The source is conventionally used to erase the memory cell. For example, the source is tailored to allow erasure through tunneling of charges between the source and the gate. Thus, the source is formed such that a portion of the source extends far enough under the gate stack to allow tunneling during erasure. The source also typically has a higher concentration of dopants than the drain. In addition, the sources of a large portion of the memory cells in a sector of flash memory are electrically coupled. The electrical coupling is typically provided by removing and isolation structures separating the sources and implanting a dopant which electrically couples the sources.

The drain is conventionally used to program the memory cell. Because tunneling of charges is not used to program the memory cell, the drain typically does not extend as far under the gate stack as the source. To provide the program voltage electrical contact is made to the drain. Typically, the area on which a drain is formed is longer than the area on which a source is formed so that contact can be made to the drain.

In order to create a flash memory cell, the gate stack is typically formed first. An implant for both the drain and source are then provided. Typically, this implant is an arsenic implant. The drain and source implant is coupled to reduce the number of masks required to form the memory cell. The drain and source implant is typically provided at a direction close to perpendicular to a surface of a semiconductor on which the memory cell is being formed. For example, typical drain and source implants occur at an angle of approximately seven degrees from perpendicular to the surface of the semiconductor. Once the drain and source implant is completed, a layer of photoresist is provided and developed to mask the drain. Any further implants used to form the source are then provided. Examples of such further implants include arsenic and phosphorus.

Although the flash memory cell formed by the above process functions, it would be beneficial to be able to further decouple the drain and source implants. For example, if the drain and source implants were decoupled, different energy implants could be used for the source and drain. Different implant energies correspond to providing the implants at different depths within the semiconductor. Moreover, if the drain and source implant were decoupled, the drain and source could be better tailored to their individual functions. However, introduction of an additional mask should be avoided if possible to prevent complication of processing.

Accordingly, what is needed is a system and method for decoupling the source and drain implants without introduction of an additional mask. The present invention addresses such a need.

SUMMARY OF THE INVENTION

The present invention provides a method and system for providing a flash memory cell on a semiconductor. In one aspect, the method and system comprise providing a plurality of gate stacks and providing a drain implant at an angle. The plurality of gate stacks define a plurality of drain areas and a plurality of source areas. The angle is measured from a direction perpendicular to the surface of the semiconductor. The angle allows the plurality of gate stacks to block the drain implant from reaching the plurality of source areas. In another aspect, the method and system comprise providing a plurality of gate stacks and providing a source implant at an angle. The plurality of gate stacks define a plurality of drain areas and a plurality of source areas. The angle is measured from a direction perpendicular to the surface of the semiconductor. The angle allows the plurality of gate stacks to block the source implant from reaching the plurality of drain areas.

According to the system and method disclosed herein, the present invention decouples the source and drain implants without requiring an additional mask.

DETAILED DESCRIPTION OF THE INVENTION

The present invention relates to an improvement in flash memory processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
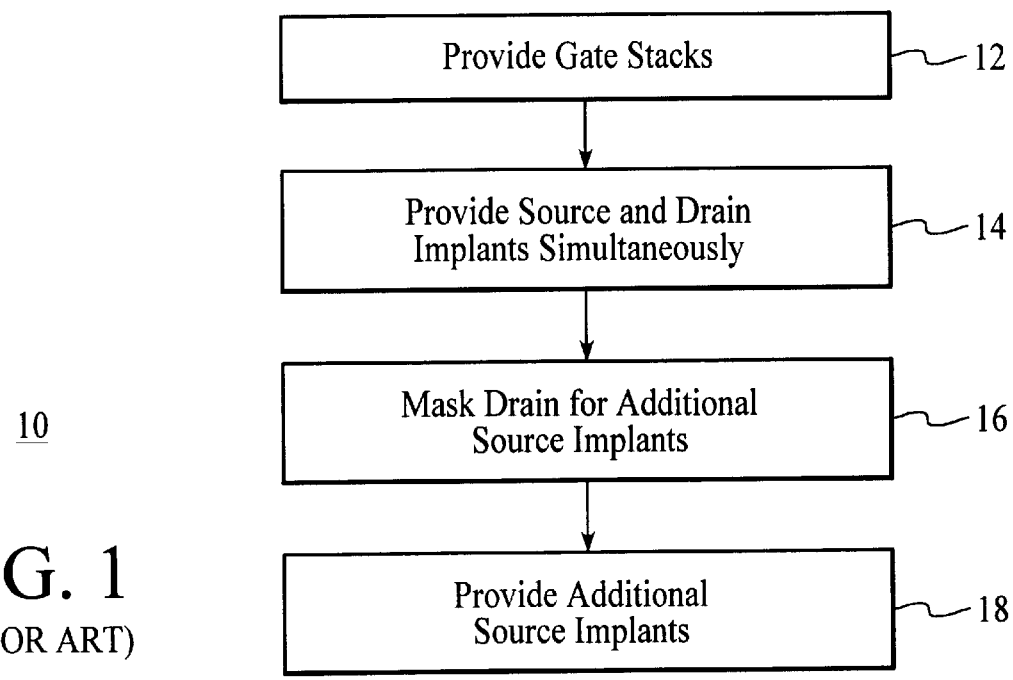
FIG. 1 is a flow chart depicting a conventional method for providing a flash memory cell.

FIG. 1 is a flow chart of a conventional method 10 for providing a conventional flash memory. A plurality of gate stacks are provided via step 12. Typically, each gate stack includes at least a floating gate and a control gate. The gate stacks define source and drain areas between the gate stacks. Self-aligned source and drain implants are then provided via step 14. In this step, a single implant is performed for both the source and the drain simultaneously. This implant is typically an arsenic implant. The source and drain areas between the gate stacks are, therefore, doped. This self-aligned implanting step reduces the number of masks required because both the source and drain are doped at the same time.

If, as is typical, further source implants are used, then the drain of each flash memory cell is masked via step 16. Typically, this masking is accomplished by providing a layer of photoresist and developing the photoresist layer to ensure that the drain is covered. Further source implants are then provided via step 18. Further source implants may include arsenic and phosphorus.

Although the method 10 shown in FIG. 1 provides a flash memory cell, those with ordinary skill in the art will realize that the method 10 limits the individualized tailoring of the source and drain. Typically, the source and drain have different functions and, therefore, different structures. For example, the source is conventionally used for erasing through tunneling between the source and the floating gate. As a result, the source extends farther under the floating gate than the drain. In addition, the source is typically more heavily doped than the drain. The source areas which are doped to become the sources are also typically not as long as the drain areas because electrical contact is made to the drain.

The present invention provides for a method and system for decoupling the source and drain implants without requiring additional masks. The present invention will be described in terms of providing a decoupled drain implant and masking the drain to provide the source implant. However, one of ordinary skill in the art will readily recognize that this method and system will operate effectively to decouple a source implant without using an additional masks. A method and system which decouples the source implant without using additional masks would be particularly beneficial in a system where the source was longer than the drain.

Figure 2:
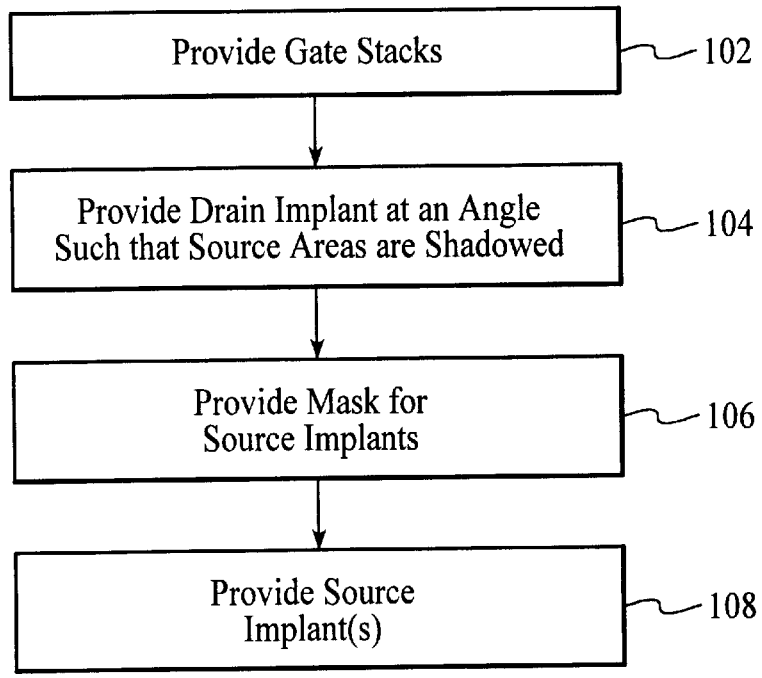
FIG. 2 is a is a flow chart depicting a method for providing a flash memory cell in accordance with the present invention.

To more particularly illustrate the method and system in accordance with the present invention, refer now to FIG. 2 depicting a flow chart of one embodiment of such a method 100. Note that only relevant steps are depicted in the method 100. Nothing prevents the insertion of additional processing steps.

A plurality of gate stacks are first provided via step 102. In a preferred embodiment, the each gate stack includes at least a floating gate and a control gate. The plurality of gate stacks define a plurality of source areas and a plurality of drain areas. A drain implant is then provided via step 104. In one embodiment, this implant is an arsenic implant. The drain implant is provided at an angle such that the source is not doped during the drain implant. In other words, a dopant used in the drain implant reaches the plurality of drain areas, but not the plurality of source areas.

A mask for the source implant is then provided via step 106. In one embodiment, the masking step 106 includes providing a layer of photoresist and developing the layer of photoresist so that only the source areas are exposed. The source implant(s) are then provided via step 108. These implants could include arsenic and phosphorus implants.

Figure 3:
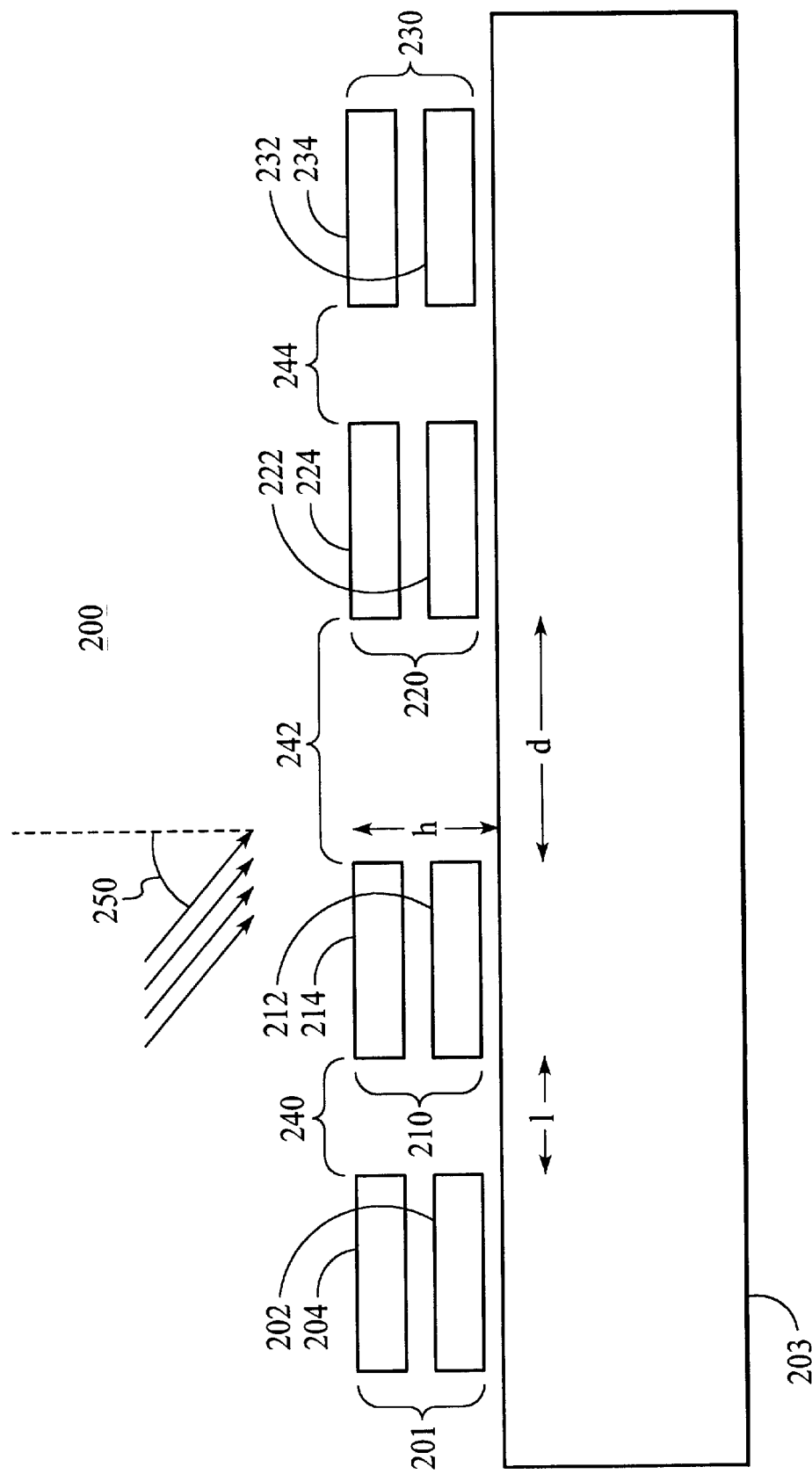
FIG. 3 is a block diagram of a flash memory during a drain implant in accordance with the present invention.

FIG. 3 is a block diagram of a flash memory 200 during the drain implanting step 104. The flash memory 200 includes a plurality of floating gates 202, 212, 222, and 232. Control gates 204, 214, 224, and 234 are disposed above floating gates 202, 212, 222, and 232. Thus, the floating gates 202, 212, 222, and 232 and the control gates 204, 214, 224, and 234, respectively, form gate stacks 201, 210, 220, and 230, respectively. The gate stacks 201, 210, 220, and 230 define source areas 240 and 244, and a drain area 242. Each gate stack 201, 210, 220, and 230 has a height h. Each source area 240 and 244 has a length 1. Typically, the length of the source area, 1, is less than the length of the drain area, d.

By implanting the drain dopant at an appropriate angle 250, the drain 242 can be doped without doping the source areas 240 or 244. The angle 250 is typically measured from a direction perpendicular to the surface of the semiconductor. The drain 242 can be doped without requiring a mask on the source areas 240 or 244 because the gate structures 201 and 220 shadow the source areas 240 and 244, respectively, at the appropriate angle. This angle is such that the tangent of the angle is at least the length of the source area 240 or 244 divided by the height of the gate stack 201, 210, 220, or 230. Thus, the tangent of the angle is greater than or equal to 1/h. Although the implant is shown such that the gate stacks 201 and 220 shadow the source areas 240 and 244, respectively, nothing prevents the use of the gate stacks 210 and 230 to shadow the source areas 240 and 244, respectively.

As device sizes decrease, the lengths of the source areas 240 and 244 and the length of the drain area 242 decreases. However, the height of the gate stacks 201, 220, 230, and 240 does not significantly decrease. Thus, the angle which allows doping of the drain area 242 while the source areas 240 and 244 are shadowed decreases as the device size decreases. As a result, when the device size is small enough, conventional implanters can be used to provide implant the drain area 242 while the source areas 240 and 244 are shadowed from the dopant.

In addition, the method 100 has been described for implanting the drain area 242 partly because the drain 242 area is typically longer than the source areas 240 and 244. Consequently, the angle which allows implanting of the drain area 242 while the source areas 240 and 244 are shadowed is smaller than an angle which would allow implanting of source areas 240 and 244 while the drain area 242 is shadowed. However, nothing prevents the method and system from being used to implant source areas 240 and 244.

A method and system has been disclosed for decoupling drain and source implants without requiring an additional mask. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for providing a flash memory cell on a semiconductor comprising:

means for providing a plurality of gate stacks, the plurality of gate stacks defining a plurality of drain areas and a plurality of source areas;

means for providing a plurality of drain implants, the plurality of drain implants including at least one drain implant at an angle, the angle being measured from a direction perpendicular to the surface of the semiconductor, the angle being such that the plurality of gate stacks blocks the at least one drain implant from reaching the plurality of source areas; and means for providing at least one source implant separately from each of the plurality of drain implants, thereby allowing each of the at least one source implant to be decoupled from each of the plurality of drain implants.

2. The system of claim 1 wherein:

each of the plurality of gate stacks further includes a height;

each of the plurality of source areas further includes a length; and the angle further has the property such that the tangent of the angle is at least the length of each of the plurality of source areas divided by the height of each of the plurality of gate stacks.

3. A system for providing a flash memory cell on a semiconductor comprising:

means for providing a plurality of gate stacks, the plurality of gate stacks defining a plurality of drain areas and a plurality of source areas;

means for providing a plurality of source implants, the plurality of source implants including at least one source implant at an angle, the angle being measured from a direction perpendicular to the surface of the semiconductor, the angle being such that the plurality of gate stacks blocks the at least one source implant from reaching the plurality of drain areas; and means for providing at least one drain implant separately from each of the at least one source implant, thereby allowing each of the plurality of source implants to be decoupled from each of the at least one drain implant.

4. The system of claim 3 wherein:

each of the plurality of gate stacks further includes a height;

each of the plurality of drain areas further includes a length; and the angle further has the property such that the tangent of the angle is at least the length of each of the plurality of drain areas divided by the height of each of the plurality of gate stacks.

5. A method for providing a flash memory cell on a semiconductor comprising the steps of:

(a) providing a plurality of gate stacks, the plurality of gate stacks defining a plurality of drain areas and a plurality of source areas;

(b) providing a plurality of drain implants, the plurality of drain implants including at least one drain at an angle, the angle being measured from a direction perpendicular to the surface of the semiconductor, the angle being such that the plurality of gate stacks block the at least one drain implant from reaching the plurality of source areas;

(c) providing at least one source implant separately from each of the plurality of drain implants, thereby allowing each of the at least one source implant to be decoupled from each of the plurality of drain implants.

6. The method of claim 5 wherein:

each of the plurality of gate stacks further includes a height;

each of the plurality of source areas further includes a length; and the angle further has the property such that the tangent of the angle is at least the length of each of the plurality of source areas divided by the height of each of the plurality of gate stacks.

7. A method for providing a flash memory cell on a semiconductor comprising the steps of:

(a) providing a plurality of gate stacks, the plurality of gate stacks defining a plurality of drain areas and a plurality of source areas; and (b) providing plurality of source implants, the plurality of source implant including at least one source implant at an angle, the angle being measured from a direction perpendicular to the surface of the semiconductor, the angle being such that the plurality of gate stacks block the at least one source implant from reaching the plurality of drain areas;

(c) providing at least one drain implant separately from each of the at least one source implant, thereby allowing each of the plurality of source implants to be decoupled from each of the at least one drain implant.

8. The method of claim 7 wherein:

each of the plurality of gate stacks further includes a height;

each of the plurality of drain areas further includes a length; and the angle further has the property such that the tangent of the angle is at least the length of each of the plurality of drain areas divided by the height of each of the plurality of gate stacks.

* * * * *